(12) United States Patent
Stadler

(10) Patent No.: US 7,725,754 B1
(45) Date of Patent: May 25, 2010

(54) DUAL CLOCK INTERFACE FOR AN INTEGRATED CIRCUIT

(75) Inventor: Laurent Fabris Stadler, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 868 days.

(21) Appl. No.: 11/500,547

(22) Filed: Aug. 8, 2006

(51) Int. Cl.
*H04L 25/00* (2006.01)
*H04L 25/40* (2006.01)
*H04L 7/00* (2006.01)

(52) U.S. Cl. .................. 713/400; 713/401; 713/500; 713/501; 713/502; 713/503; 713/600; 713/601; 325/371; 327/141; 327/144; 327/163

(58) Field of Classification Search ............... 713/400, 713/401, 500–503, 600, 601; 325/371; 327/141, 327/144, 163
See application file for complete search history.

(56) References Cited

U.S. PATENT DOCUMENTS

| 6,128,359 | A  | * | 10/2000 | Volk ........................ 375/371 |
| 6,239,626 | B1 | * | 5/2001  | Chesavage ................ 327/99 |
| 6,424,180 | B1 | * | 7/2002  | Killorn ..................... 327/12 |
| 7,173,495 | B1 | * | 2/2007  | Kenny et al. .............. 331/49 |
| 7,227,393 | B1 | * | 6/2007  | Savoj ...................... 327/147 |
| 2003/0128789 | A1 | * | 7/2003 | Drerup et al. ............ 375/371 |
| 2004/0086061 | A1 | * | 5/2004 | Lundberg ................ 375/316 |
| 2006/0158225 | A1 | * | 7/2006 | Stojanovic et al. ......... 326/87 |

* cited by examiner

*Primary Examiner*—Abdelmoniem Elamin
(74) *Attorney, Agent, or Firm*—W. Eric Webostad; Kevin T. Cuenot

(57) ABSTRACT

A dual clock interface for an integrated circuit is described. An integrated circuit includes interface circuitry. The interface circuitry has a hardwired logic block. The hardwired logic block has a clock divider circuit coupled to receive a user clock signal and a core clock signal for dividing the core clock signal responsive to a frequency of the user clock signal to provide a divided clock signal with edges aligned to the core clock signal. The divided clock signal has the frequency of the user clock signal and a phase relationship of the user clock signal. User-side logic is coupled to receive the divided clock signal for the controlled passing of information responsive to the divided clock signal. Core-side logic is coupled to receive the core clock signal for the controlled passing of information responsive to the core clock signal.

20 Claims, 6 Drawing Sheets

DUAL CLOCK INTERFACE FOR AN INTEGRATED CIRCUIT

FIELD OF THE INVENTION

One or more aspects of the invention relate generally to integrated circuits and, more particularly, to a dual clock interface for an integrated circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation. One such FPGA is the Xilinx Virtex® FPGA available from Xilinx, Inc., 2100 Logic Drive, San Jose, Calif. 95124.

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

An integrated circuit, such as an FPGA, may include one or more interfaces for communicating information. There are many known types of interfaces, such as a Peripheral Component Interconnect ("PCI"), a Universal Serial Bus ("USB"), and Ethernet, among other known interfaces. For purposes of clarity, by way of example it shall be assumed that a PCI Express ("PCIe") interface is used for an integrated circuit, although it shall be appreciated from the following description that other types of known interfaces may be used.

For operation of a PCIe interface, a user clock and a core clock are supplied. Conventionally, the user clock and the core clock are synchronous with respect to one another and are edge-aligned with some uncertainty. For example, the user clock may be rising edge-aligned to rising edges of the core clock with some uncertainty. Furthermore, for a PCI, the core clock signal is provided at a standard specified frequency, which for a PCIe is presently approximately 250 MHz. However, uncertainty with respect to such edge alignment translates into having to have larger timing margins. In short, this means that the "windows of operation" have to be increased to accommodate such uncertainty, which generally slows performance.

Accordingly, it would be desirable and useful to provide a dual clock interface that at least reduces the above-described uncertainty such that performance may be enhanced with narrower timing margins.

SUMMARY OF THE INVENTION

One or more aspects of the invention generally relate to integrated circuits and, more particularly, to a dual clock interface for an integrated circuit.

An aspect of the invention is an integrated circuit including interface circuitry for controlled passing of information to and from the integrated circuit. The interface circuitry has a hardwired logic block for receiving a user clock signal and a core clock signal. The hardwired logic block has a clock divider circuit coupled to receive the user clock signal and the core clock signal. The clock divider circuit is configured to divide the core clock signal responsive to a frequency of the user clock signal to provide a divided clock signal. The clock divider circuit is further configured to provide the divided clock signal with edges aligned to the core clock signal. The divided clock signal has the frequency of the user clock signal and a phase relationship of the user clock signal. User-side logic is coupled to receive the divided clock signal for the controlled passing of information responsive to the divided clock signal. Core-side logic is coupled to receive the core clock signal for the controlled passing of information responsive to the core clock signal.

Another aspect of the invention is a method for providing a dual clock domain interface in an integrated circuit. A user clock signal and a core clock signal are received, the user clock signal and the core clock signal being synchronous with respect to one another but with a degree of edge alignment uncertainty. The user clock signal is sampled for edge alignment between the user clock signal and the core clock signal, the sampling being at a frequency of the core clock signal. Edges of the user clock signal and the core clock signal, being sufficiently aligned for detection, are detected. An internal clock signal having a pulse is generated. The pulse is generated responsive to the edges being sufficiently aligned for the detecting. The pulse has a phase relationship associated with the user clock signal and edge positioning associated with the core clock signal. A user-side clock domain is clocked responsive to the internal clock signal, and a core-side clock domain is clocked responsive to the core clock signal. The degree of edge alignment uncertainty is reduced responsive to use of the edge positioning of the core clock signal in the internal clock signal for the clocking of the user-side clock domain.

Yet another aspect of the invention is an interface system, including an integrated circuit having a peripheral component interface with a user-side clock domain and a core-side clock domain. At least one peripheral device is coupled to the integrated circuit via the core-side clock domain of the peripheral component interface for transporting information to and from the integrated circuit. The integrated circuit is coupled to receive a user clock signal and a core clock signal. The user clock signal and the core clock signal are synchronous with respect to one another but with a degree of edge alignment uncertainty. The peripheral component interface is configured to sample at a frequency of the core clock signal the user clock signal for edge alignment between the user clock signal and the core clock signal. The peripheral component interface is configured to detect edges of the user clock signal and the core clock signal responsive to when such edges are sufficiently aligned for detection. The peripheral component interface is configured to generate an internal clock signal having a pulse. The pulse is generated responsive to the edges being sufficiently aligned for the detecting. The pulse has a phase relationship associated with the user clock signal and has edge positioning associated with the core clock signal. The user-side clock domain is coupled for being clocked responsive to the internal clock signal, and the core-side clock domain is coupled for being clocked responsive to the core clock signal. The degree of edge alignment uncertainty is reduced responsive to use of the edge positioning of the core clock signal in the internal clock signal for clocking of the user-side clock domain.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
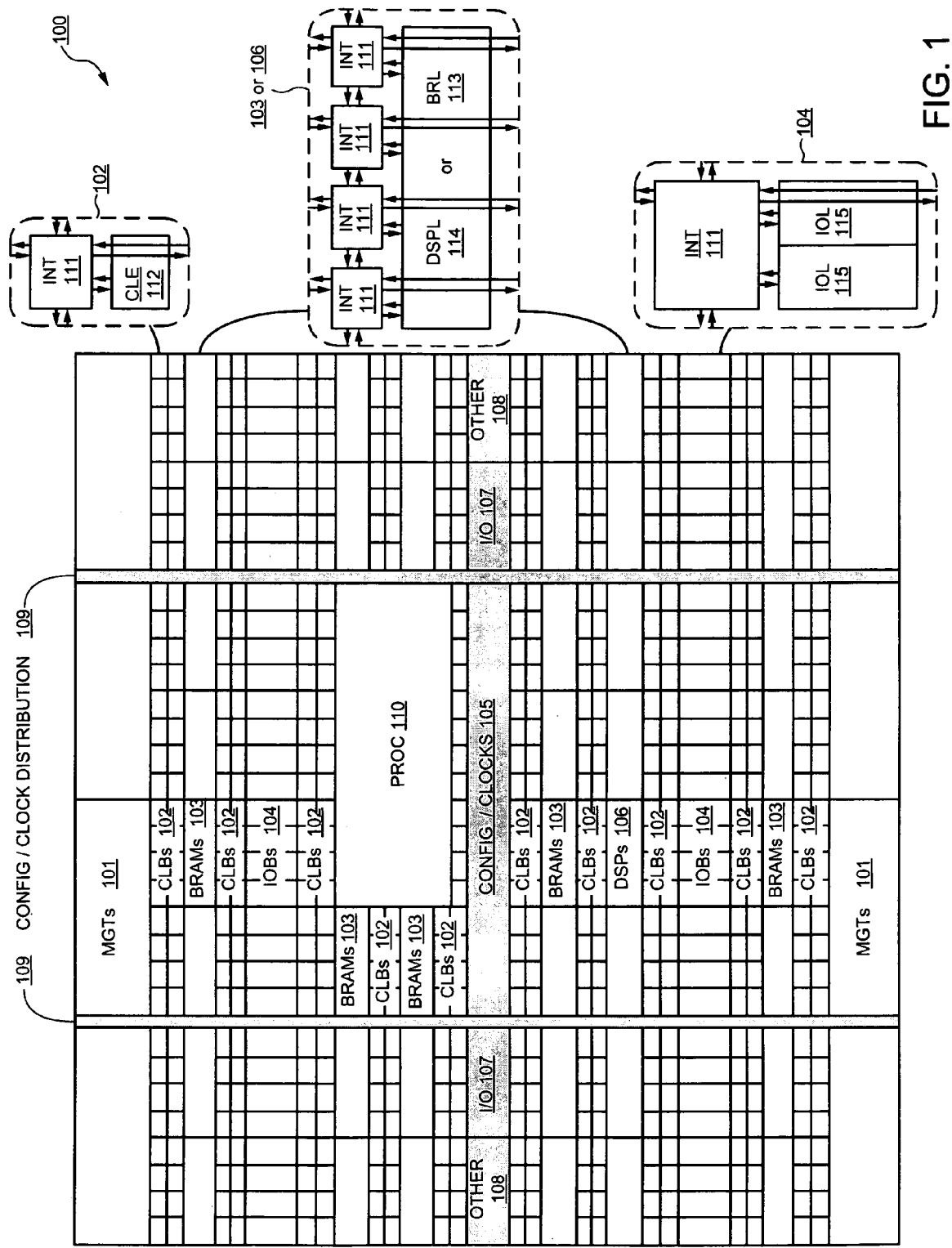
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
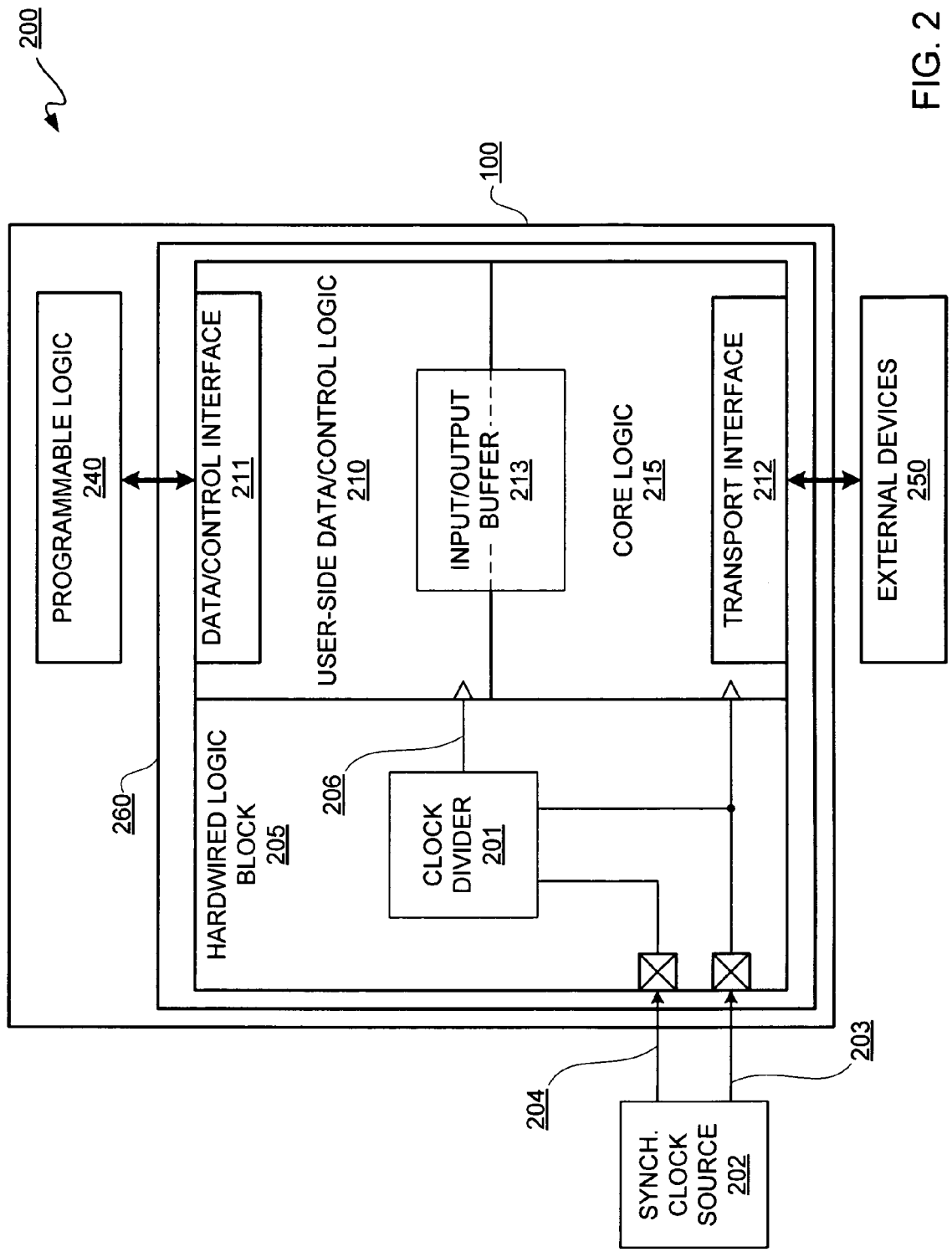
FIG. 2 is a block diagram depicting an exemplary embodiment of an integrated circuit system.

FIG. 2 is a block diagram depicting an exemplary embodiment of an integrated circuit system 200. In this particular example, integrated circuit system 200 includes FPGA 100 of FIG. 1. However, it should be appreciated that any integrated circuit having an interface with two clock domains may be used, as described below in additional detail. System 200, in addition to FPGA 100, may include one or more external devices 250, as well as a synchronous clock source 202. Alternatively, synchronous clock source 202 may be internal to FPGA 100. FPGA 100 includes internal interface 260 and programmable logic 240. In this particular example, interface 260 is for a PCIe interface, although, as shall be more clearly understood from the following description, any interface having two clock domains with a degree of uncertainty therebetween may be implemented.

Synchronous clock source 202, which for example may be a phase-locked loop or a delay-locked loop, or some other synchronous clock source, is used to provide core clock signal 203 and user clock signal 204. Core clock signal 203 and user clock signal 204 are synchronous with respect to one another and edge-aligned with respect to one another, although there is some degree of uncertainty with respect to such edge alignment. For purposes of clarity by way of example and not limitation, it shall be assumed that core clock signal 203 and user clock signal 204 are rising-edge-aligned, though falling-edge-aligned signaling may be used.

Core clock signal 203 and user clock signal 204 are provided to respective pads of FPGA 100 and, more particularly, to pads coupled to a hardwired logic block 205 of internal interface 260. Hardwired logic block 205 receives core clock signal 203 and user clock signal 204 to a clock divider circuit 201 thereof. Clock divider circuit 201 may be configured to divide core clock signal 203 responsive to a frequency of user clock signal 204. It should be appreciated that for a user implementation, such as a user design implemented in programmable logic 240, a number of different frequencies may be used for user clock signal 204. There may not be advance knowledge of the particular frequency at which user clock signal 204 is provided. Accordingly, clock divider circuit 201 may be configured to automatically divide core clock signal 203 to provide a divided clock signal 206 output from clock divider circuit 201 with a frequency of user clock signal 204. For the particular example of a PCIe interface, core clock signal 203 may be set at approximately 250 MHz, and thus divided clock signal 206 may be set equal to the 250 MHz frequency or to a fraction thereof. In other words, depending on the frequency of user clock signal 204, clock divider circuit 201 may be configured to allow the division ratios of divide-by-1, -2, and -4, for example.

As described below in additional detail, in order to reduce uncertainty as between user clock signal 204 and core clock signal 203, divided clock signal 206 may be provided with edges aligned to core clock signal 203. Again, for purposes of clarity by way of example and not limitation, rising edge aligned signals are described below in additional detail.

Internal interface 260 includes core logic 215 and user-side data/control logic 210. User-side data/control logic 210 is clocked responsive to divided clock signal 206, and core logic 215 is clocked responsive to core clock signal 203. User-side data/control logic 210 includes data/control interface 211, and core logic 215 includes a transport protocol interface, such as a Gigabit Transceiver Protocol ("GTP") interface for a PCIe implementation, namely "transport interface 212." Transport interface 212 is for communicating with one or more external devices 250 external to FPGA 100. Data/control interface 211 is for communicating with programmable logic 240 internal to FPGA 100. For a PCIe implementation, data/control interface 211 includes a LocalLink and a Management Port for data signaling and control signaling, respectively.

Although separate input/output buffers may be used for user-side data/control logic 210 and core logic 215, in this particular example, user-side data/control logic 210 and core logic 215 share input/output buffer 213. A user-side portion of input/output buffer 213 is clocked responsive to divided clock signal 206 and a core side of input/output buffer 213 is clocked responsive to core clock signal 203. This sharing of input/output buffering may be implemented using dual ported random access memory, such as BRAM 103 of FPGA 100.

Accordingly, it should be appreciated that generally there are two clock domains of internal interface 260, namely one operating responsive to divided clock signal 206 and another operating responsive to core clock signal 203. Divided clock signal 206 is used to drive I/Os for communicating to and from programmable logic 240. This forms internal data/control passing of information. Transport interface for communicating with external devices 250 is clocked responsive to core clock signal 203 for controlled input/output passing of information. It should be appreciated that transport interface 212 for a PCIe implementation is a scalable interface. In other words, various bit widths may be used for communicating with external devices 250. However, all communication may be done at the standard set clock rate, which continuing the above example may be approximately 250 MHz.

In the following description, an example implementation of clock divider circuit 201 is provided for automatic division by 1, 2, or 4 of a clock rate of core clock signal 203. Although these particular numerical examples are used, it should be appreciated from the following description that other values may be used for dividing the frequency of core clock signal 203 to provide the frequency of divided clock signal 206.

Figure 3A:
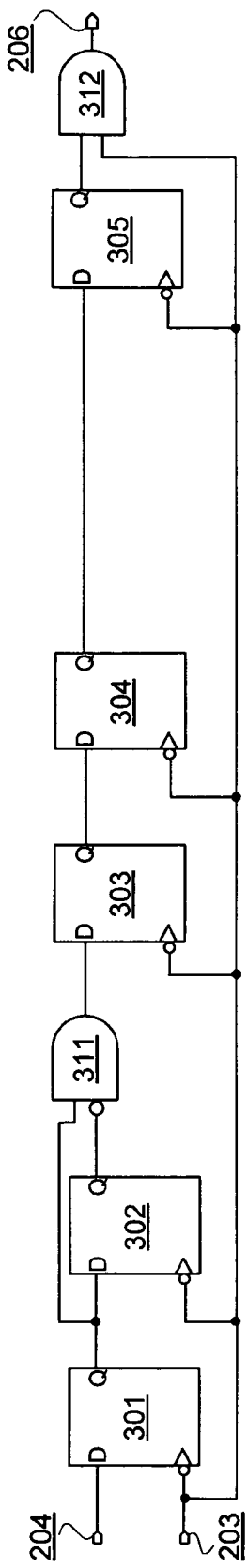
FIG. 3A is a circuit diagram depicting an exemplary embodiment of a clock divider circuit.

FIG. 3A is a circuit diagram depicting an exemplary embodiment of a clock divider circuit 201A. In this example, divide-by-2 and divide-by-4 configurations are supported, but a divide-by-1 configuration is not. It shall be shown with reference to clock divider circuit 201B of FIG. 3B how this example of FIG. 3A may be modified to support a divide-by-1 option as well. Notably, clock divider circuits 201A and 201B are alternative examples of clock divider circuit 200 of FIG. 2.

With reference to FIG. 3A, user clock signal 204 is provided as a data input to a first stage flip-flop 301. Notably, for rising-edge sampling, falling-edge-triggered flip-flops 301 through 305 may be used. Falling-edge-triggered flip-flops 301 through 305 are all respectively clocked responsive to core clock signal 203. Output of flip-flop 301 is provided as an input to second stage flip-flop 302 and as an input to AND gate 311. Output of second stage flip-flop 302 is inverted and provided as an input to AND gate 311. Output of AND gate 311 is provided as a data input to flip-flop 303.

Output of flip-flop 303 is provided as a data input to flip-flop 304, and output of flip-flop 304 is provided as a data input to flip-flop 305. Output of flip-flop 305 is provided as an input to AND gate 312, and another input to AND gate 312 is core clock signal 203. Output of AND gate 312 is divided clock signal 206.

Notably, the number of flip-flops used for clock divider circuit 201 of FIG. 2 may be responsive to a greatest common multiple of edges for divide-by operations. Thus, for example, if the greatest common multiple of rising edges between a divide-by-2 and a divide-by-4 clock is four, there may be four flip-flops plus one extra flip-flop to provide the proper phase relationship. Thus, for example, if output of flip-flop 301 is logic high and output of flip-flop 302 is a logic low which is inverted for input to AND gate 311, then output of AND gate 311 will be a logic high. A logic high output from AND gate 311 indicates that a rising edge of user clock signal 204 has been sampled. However, for a divide-by-4 implementation, such rising edge clock sampled two clock cycles delayed due to flip-flops 301 and 302 may be out of phase with user clock signal 204. In order to adjust for this phase difference, the logic 1 output from AND gate 311 propagates through flip-flops 303, 304, and 305 for an additional three more clock cycles such that the logic 1 output from flip-flop 305 and AND'd with core clock signal 203 by AND gate 312 provides divided clock signal 206 with a phase relationship associated with user clock signal 204.

Each logic high output from AND gate 311 indicates the rising edge sampled from user clock signal 204 that is aligned with a rising edge of core clock signal 203. These rising edges provide a "gated" output, such as from AND gate 311, to provide a digital rising edge detector. Because output of flip-flop 305 may be a logic 1 for a longer logic high time than one pulse of core clock signal 203, output of AND gate 312, namely divided clock signal 206, may effectively pass individual pulses of core clock signal 203.

Notably, it should be appreciated that clock divider circuit 201A may be transparent to a user. In other words, provided a user inputs a user clock signal 204 of a supported frequency, divided clock signal 206 may be generated without further user involvement. Furthermore, it should be appreciated that flip-flops 301 through 305 are all configured for feed-forward operation. In other words, clock divider circuit 201A is a feed-forward circuit. Thus, by avoiding having to have the capability to reset clock divider circuit 201A, invalid states due to resetting at the wrong time may be avoided. Furthermore, if "garbage" is input to clock divider circuit 201A, N cycles later where N is an integer value of the number of sequential circuits in series, such "garbage" begins clocking out. Thus, invalid states are not stored after a sufficient number of cycles of operation of clock divider circuit 201A.

Figure 3B:
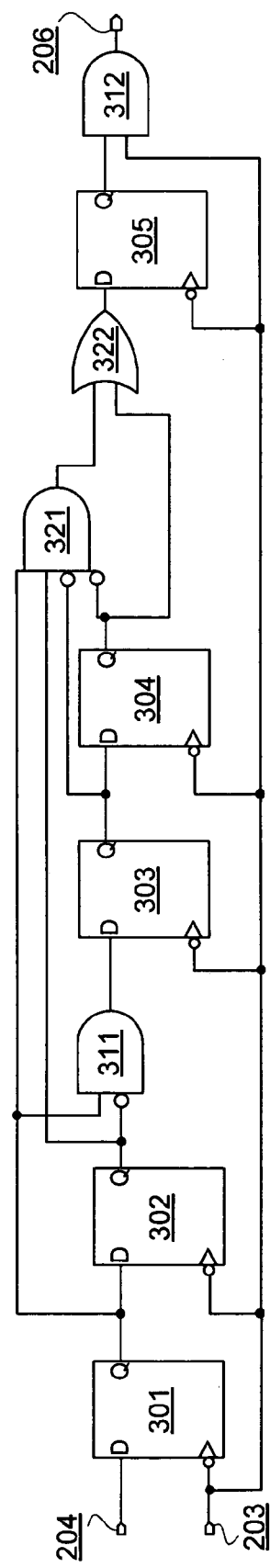
FIG. 3B is a circuit diagram depicting an alternate exemplary embodiment of a clock divider circuit.

FIG. 3B is a circuit diagram depicting an alternate exemplary embodiment of clock divider circuit 201A, namely clock divider circuit 201B. Clock divider circuit 201B of FIG. 3B supports a divide-by-1 mode for core clock signal 203. Clock divider circuit 201B of FIG. 3B is similar to the example of clock divider circuit 201A of FIG. 3A except for the differences which are described below in additional detail.

Output of flip-flop 301 is provided as an input to AND gate 321. Output of flip-flop 302 is provided as another input to AND gate 321. Output of flip-flop 303 is inverted and provided as yet another input to AND gate 321. Lastly, output of flip-flop 304 is inverted and provided as an input to AND gate 321. Output of flip-flop 304 is also provided as an input to OR gate 322. Output of AND gate 321 is provided as another input to OR gate 322. Output of OR gate 322 is provided as a data input to flip-flop 305.

Thus, the direct coupling of output of flip-flop 304 to a data input of flip-flop 305, as described with reference to FIG. 3A, has been altered by the inclusion of AND gate 321 and OR gate 322. Additionally, outputs of flip-flops 301 and 302, as well as inverted outputs of flip-flops 303 and 304, are provided as inputs to AND gate 321 for providing another input to OR gate 322. It should be appreciated that if user clock signal 204 and core clock signal 203 are generally the same signal, namely generally the same frequency, core clock signal 203 may not effectively be used to sample itself. Furthermore, it should be appreciated that if both user clock signal 204 and core clock signal 203 are essentially the same signal, one of such signals is not needed. Thus, core clock signal 203 may be effectively used in place of user clock signal 204 to avoid a degree of uncertainty, as previously described. Thus, in this particular example, user clock signal 204 may be tied to a logic high level, and after five clock cycles, when no rising edge has been detected, output of flip-flop 305 will stay at a logic high state. Accordingly, output of AND gate 312, namely divided clock signal 206, is thus essentially core clock signal 203.

Figure 4:
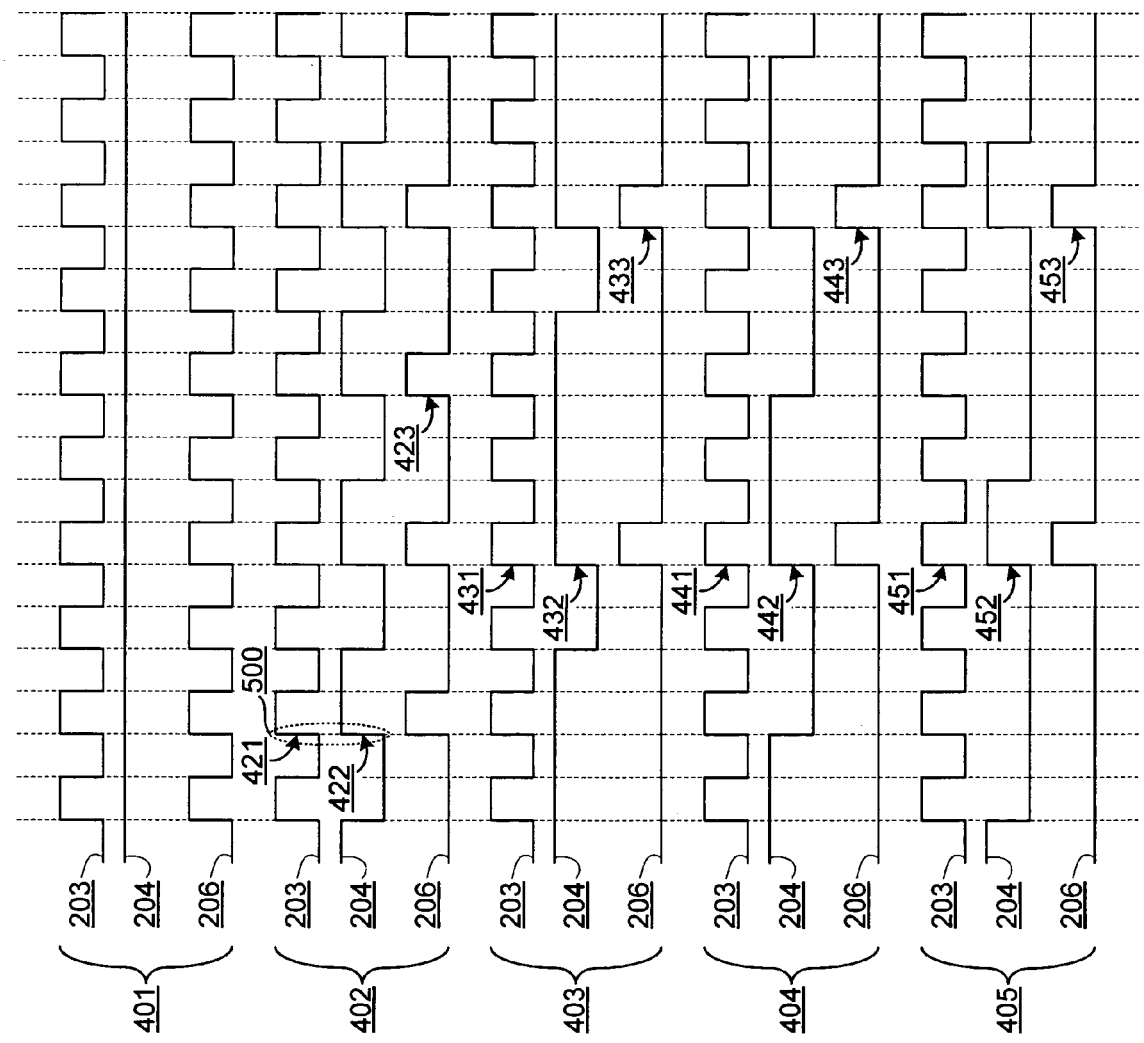
FIG. 4 is a timing diagram depicting five respective exemplary timing examples.

FIG. 4. is a timing diagram depicting respective exemplary timing examples 401 through 405. As illustratively shown, core clock signal 203 is provided for each of examples 401 through 405. In example 401, user clock signal 204 is tied to a logic high level. Accordingly, output of AND gate 312 of FIG. 3B will essentially be core clock signal 203 as indicated by divided clock signal 206 of example 401. Divided clock signal 206 of example 401 may be output from clock divider circuit 201B of FIG. 3B.

Figure 5:
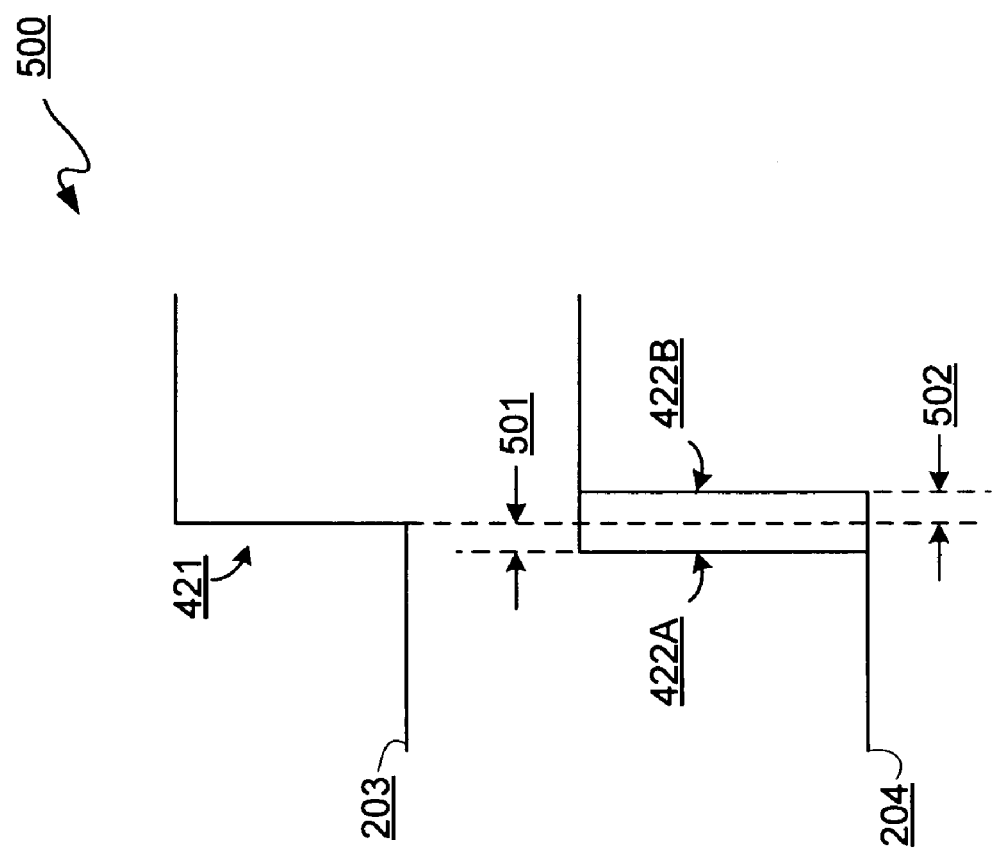
FIG. 5 is an enlarged view of a portion of the timing diagram of FIG. 4.

In example 402, user clock signal 204 is half the frequency of, and rising-edge phase-aligned with, core clock signal 203. Notably, there may be a degree of leading uncertainty 501 or lagging uncertainty 502 between the rising-edge phase alignment of core clock signal 203 and a leading rising edge 422A or a lagging rising edge 422B of user clock signal 204, as indicated in the enlarged view 500 illustratively shown in FIG. 5. Notably, rising edge 422 is illustratively shown as being anywhere within a range of locations as generally indicated by rising edges 422A and 422B of FIG. 5. However, rising edge 421 of core clock signal 203 is sufficiently aligned with rising edge 422 of user clock signal 204 for detection. Detection of phase-aligned rising edges 421 and 422 causes output of a pulse 423, four clock cycles later, of divided clock signal 206, where divided clock signal 206 is output by clock divider circuit 201A or 201B of FIG. 3A or 3B, respectively. Notably, all of the following examples 403 through 405 may be for clock divider circuit 201A or 201B of FIGS. 3A and 3B, respectively. Furthermore, all of the following examples 403 through 405 have an uncertainty with regard to rising-edge alignment as previously described with reference to FIG. 5 and example 402.

Example 403 is for user clock signal 204 having a quarter of the frequency of core clock signal 203 and having a three-quarter duty cycle, namely a 75% high time and 25% low time duty cycle. Rising edges 431 and 432 respectively of core clock signal 203 and user clock signal 204 may be detected as being sufficiently aligned, as previously described. Accordingly, four cycles later of core clock signal 203, a pulse 433 responsive to detection of aligned rising edges 431 and 432 may be output for providing divided clock signal 206.

In example 404, user clock signal 204 is a quarter of the frequency of core clock signal 203, and user clock signal 204 has a 50/50 duty cycle. Thus, detection of approximately phase-aligned rising edges 441 and 442 respectively of core clock signal 203 and user clock signal 204 may be used to provide an output pulse 443 four clock cycles later for providing divided clock signal 206.

In example 405, user clock signal 204 is a quarter of the frequency of core clock signal 203, and user clock signal 204 has a one-quarter duty cycle, namely 25% high time and 75% low time. In this example, rising edge 451 of core clock signal 203 is approximately phase-aligned with rising edge 452 of user clock signal 204. The detected sufficiently phase-aligned rising edges 451 and 452 cause pulse 453 to be output four clock cycles later for providing divided clock signal 206. These are but a few examples of outputs that may be provided, and accordingly it should be appreciated that other divisors may be used, as well as same or different duty cycles, for providing divided clock signal 206.

In each of examples 402 through 405, an edge of a core clock signal is generally transferred to an edge of an internal user clock signal. For example, in example 402, rising edge 421 of core clock signal 203 is generally transferred to rising edge 423 of divided clock signal 206. As there generally is little or no uncertainty of a clock signal to itself, such as core clock signal 203 to itself, uncertainty as between clock signals, such clock signals 203 and 204, is at least reduced. Additionally, in each of examples 402 through 405, as a rising edge is detected from a supplied clock signal, such as user clock signal 204, as being sufficiently aligned with an edge of a reference clock signal, such as core clock signal 203, such detection causes the edge of the reference clock signal to be generally transferred to an internal clock signal, such as divided clock signal 206. Such transferred edge to such internal clock signal generally maintains the phase relationship of the supplied clock signal with respect to the reference clock signal, though with some latency, and less uncertainty as the transferred edge is of the reference clock signal. Because of a reduction in uncertainty, timing margin in an interface circuit design may be reduced. Accordingly, performance may be enhanced with such a reduction in uncertainty. Notably, because delay associated with internal circuitry is sufficiently well-known, such delay may be accounted for in routing for implementation of a hardwired clock divider circuit 201 to avoid or have an insignificant amount of uncertainty between the internal clock signal and the reference clock signal.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. An integrated circuit, comprising:
    interface circuitry for controlled passing of information to and from the integrated circuit;
    the interface circuitry having:
        a hardwired block for receiving a user clock signal and a core clock signal;
        the hardwired block having a clock divider circuit coupled to receive the user clock signal and the core clock signal;
        the clock divider circuit configured to divide the core clock signal responsive to a frequency of the user clock signal to provide a divided clock signal;
        the clock divider circuit further configured to provide the divided clock signal with edges aligned to the core clock signal;
        the divided clock signal having the frequency of the user clock signal but the divided clock signal having pulses of a pulse width equal to a pulse width of pulses of the core clock signal;
        the pulses of the divided clock signal having the edges aligned to the pulses of the core clock signal with a phase relationship of the user clock signal;
        wherein edges of a single pulse of the divided clock signal are aligned to edges of a single pulse of the core clock signal;
        a user-side resource coupled to receive the divided clock signal for the controlled passing of information responsive to the divided clock signal; and
        a core-side resource coupled to receive the core clock signal for the controlled passing of information responsive to the core clock signal.

2. The integrated circuit according to claim 1, wherein the core clock signal and the user clock signal are synchronous with respect to one another.

3. The integrated circuit according to claim 2, wherein the core clock signal and the user clock signal are positive edge-aligned with respect to one another.

4. The integrated circuit according to claim 1, wherein the integrated circuit further comprises programmable logic, the divided clock signal clocking input/output circuits for the controlled passing of information to and from the programmable logic.

5. The integrated circuit according to claim 4, wherein the input/output circuits provide a Management port for control signals and a LocalLink for data signals of a Peripheral Component Interconnect Express interface.

6. The integrated circuit according to claim 1, wherein the user-side resource and the core-side resource share an input/output buffer, the input/output buffer being clocked on a user-side portion responsive to the divided clock signal and being clocked on a core-side portion responsive to the core clock signal.

7. The integrated circuit according to claim 6, wherein the input/output buffer is a dual ported random access memory.

8. The integrated circuit according to claim 1, wherein the core-side resource includes a transport protocol interface for communicating with one or more devices external to the integrated circuit.

9. The integrated circuit according to claim 8, wherein the transport protocol interface is clocked responsive to the core clock signal; and wherein the core clock signal is set at a standard clock rate for operation of the transport protocol interface.

10. The integrated circuit according to claim 9, wherein the transport protocol interface is scalable in bit width for operation at the standard clock rate.

11. The integrated circuit according to claim 10, wherein the transport protocol interface is a Gigabit Transceiver Protocol interface of a Peripheral Component Interconnect.

12. The integrated circuit according to claim 1, wherein the divided clock signal is provided with a clock rate of the core clock signal divided by any one of 1, 2, or 4.

13. A method for providing a dual clock domain interface in an integrated circuit, comprising:
    receiving a user clock signal and a core clock signal, the user clock signal and the core clock signal being synchronous with respect to one another but with a degree of edge alignment uncertainty;
    sampling the user clock signal for edge alignment between the user clock signal and the core clock signal, the sampling being at a frequency of the core clock signal;
    detecting edges of the user clock signal and the core clock signal responsive to when the edges are sufficiently aligned for detection;
    generating an internal clock signal having a pulse;
    the pulse being generated responsive to the edges being sufficiently aligned for the detecting;
    the pulse having a phase relationship associated with the user clock signal and having edge positioning associated with the core clock signal;
    the internal clock signal having a frequency of the user clock signal but the internal clock signal having pulses of a pulse width equal to a pulse width of pulses of the core clock signal;
    edges of the pulse of the internal clock signal being aligned to edges of a pulse of the core clock signal with either a rising or falling edge of the edges of the pulse of the internal clock signal having the phase relationship of the user clock signal;
    clocking a user-side clock domain responsive to the internal clock signal; and
    clocking a core-side clock domain responsive to the core clock signal;
    wherein the degree of edge alignment uncertainty is reduced responsive to use of the edge positioning of the core clock signal in the internal clock signal for the clocking of the user-side clock domain.

14. The method according to claim 13, wherein the user-side clock domain is coupled between programmable logic of the integrated circuit and the core-side clock domain.

15. The method according to claim 14, wherein the core-side clock domain is coupled between one or more external devices to the integrated circuit and the user-side clock domain.

16. The method according to claim 15, wherein first data is passed from the core-side clock domain into the user-side clock domain via an input/output buffer, the input/output buffer having the first data clocked therein responsive to the core clock signal and having the first data clocked thereout responsive to the internal clock signal.

17. The method according to claim 16, wherein second data is passed from the user-side clock domain into the core-side clock domain via the input/output buffer, the input/output buffer having the second data clocked therein responsive to the user clock signal and having the second data clocked thereout responsive to the core clock signal.

18. The method according to claim 17, wherein the input/output buffer is a dual ported memory internal to the integrated circuit.

19. An interface system, comprising:
an integrated circuit having a peripheral component interface, the peripheral component interface having a user-side clock domain and a core-side clock domain;
at least one peripheral device coupled to the integrated circuit via the core-side clock domain of the peripheral component interface for transporting information to and from the integrated circuit;
the integrated circuit coupled to receive a user clock signal and a core clock signal;
the user clock signal and the core clock signal being synchronous with respect to one another but with a degree of edge alignment uncertainty;
the peripheral component interface configured to sample at a frequency of the core clock signal the user clock signal for edge alignment between the user clock signal and the core clock signal;
the peripheral component interface configured to detect edges of the user clock signal and the core clock signal responsive to when the edges are sufficiently aligned for detection;
the peripheral component interface configured to generate an internal clock signal having a pulse;
the pulse being generated responsive to the edges being sufficiently aligned for the detecting;
the pulse having a phase relationship associated with the user clock signal and having edge positioning associated with the core clock signal;
the internal clock signal having a frequency of the user clock signal but the internal clock signal having pulses of a pulse width equal to a pulse width of pulses of the core clock signal;
edges of the pulse of the internal clock signal being aligned to edges of a pulse of the core clock signal with either a rising or falling edge of the edges of the pulse of the internal clock signal having the phase relationship of the user clock signal;
the user-side clock domain coupled for being clocked responsive to the internal clock signal; and
the core-side clock domain coupled for being clocked responsive to the core clock signal;
wherein the degree of edge alignment uncertainty is reduced responsive to use of the edge positioning of the core clock signal in the internal clock signal for clocking of the user-side clock domain.

20. The interface system according to claim 19, wherein the user-side clock domain is coupled between programmable logic of the integrated circuit and the core-side clock domain.

* * * * *